United States Patent
Pullen et al.

(10) Patent No.: US 6,229,389 B1
(45) Date of Patent: May 8, 2001

(54) CLASS D MODULATOR WITH PEAK CURRENT LIMIT AND LOAD IMPEDANCE SENSING CIRCUITS

(75) Inventors: Stuart W. Pullen, Raleigh, NC (US); Harold A. Witlinger, Pennington, NJ (US)

(73) Assignee: Intersil Corporation, Palm Bay, FL (US)

(*) Notice: Subject to any disclaimer, the term of this patent is extended or adjusted under 35 U.S.C. 154(b) by 0 days.

(21) Appl. No.: 09/438,210

(22) Filed: Nov. 12, 1999

Related U.S. Application Data

(60) Provisional application No. 60/108,942, filed on Nov. 18, 1998.

(51) Int. Cl.[7] .................................................. H03F 3/38
(52) U.S. Cl. ........................................ 330/10; 330/207 P
(58) Field of Search .............................. 330/10, 207 A, 330/251, 207 P, 298

(56) References Cited

U.S. PATENT DOCUMENTS 5,805,020 * 9/1998 Danz et al. ........................ 330/10
6,016,075 * 9/1998 Hamo ................................. 330/10
6,107,875 * 8/2000 Pullen et al. ...................... 330/10
6,108,182 * 8/2000 Pullen ............................... 361/89

* cited by examiner

Primary Examiner—Robert Pascal
Assistant Examiner—Henry Choe
(74) Attorney, Agent, or Firm—Jaeckle Fleischmann & Mugel, LLP

(57) ABSTRACT

The OCL 200 receives two logic signals: the first, OC upper FET, is high when an over current condition exists in the upper FET 22; the second, OC lower FET, is high when an over current condition exists in the lower FET 24. When the over current condition is in FET 22, PMOS 212 turns on and injects current into the summing junction of the integrator 10 through Rcl. The net effect is turn off the upper FET 22 and turn on the lower FET 24. This reduces the current in FET 22. As far as amplifier 100 is concerned, the net effect is gain compression. Since upper FET 22 is on less and the lower FET 24 is on more, the gain of the audio signal is reduced. When the over current condition is in FET 24, NMOS 213 turns on and pulls current out of the summing junction, turns the lower FET 24 off, and turns the upper FET 22 on. The net effect is to reduce the current in the lower FET. At audio frequencies, the gain is reduced.

14 Claims, 4 Drawing Sheets

CLASS D MODULATOR WITH PEAK CURRENT LIMIT AND LOAD IMPEDANCE SENSING CIRCUITS

This application is a conversion of provisional application Serial No. 60/108,942 filed Nov. 18, 1998, the entire disclosure of which is incorporated by reference.

This invention implements a new technique for active current limit in a class D self-oscillating variable frequency amplifier. This invention can also sense the load impedance and take appropriate action. The amplifier enters current limit when the speaker impedance is abnormally low and shuts down when the output is shorted.

BACKGROUND OF THE INVENTION

Most transistor amplifiers are either class A, AB or B. the output transistors are usually bipolar transistors that are operated in their linear region. Current limit is implemented using sense resistors in series with the output transistors to develop a voltage proportional to the output current. When this voltage is too high, the base current of the output transistors is limited, thus limiting the output current to a safe level. Linear amplifiers using MOSFETs employ similar circuits to limit the gate voltage on the output MOSFETs in order to limit the output current. These approaches do not work in class D amplifiers because the MOSFETs are either off or fully enhanced. The traditional solution is too offer over current latch off as opposed to current limit. In that solution sense resistors are placed in series with the MOSFETs. When the voltage across the sense resistors is too high, the amplifier shuts down. The drawback to that approach is that the impedance of speakers varies with frequency, and it may dip low enough at some frequencies to shut down the amplifier.

It is possible to regulate the output current with a separate control loop, which is independent of the audio loop. The goal of the second loop is to override the main control loop when the current is excessive. The disadvantage of this approach is that it is expensive and relatively difficult to stabilize due to the delays associated with filtering the voltage across the sense resistor to remove the noise associated with switching transitions.

SUMMARY

A better solution would limit current when the speaker impedance dips to an unsafe level or many speakers are connected in parallel by the end user, and to shut down the amplifier when the output is shorted. Some filtering is also desired before shutdown, so that if the output is only shorted for a brief instant, the amplifier does not shut down. With this approach nuisance shut downs are minimized, and the amplifier is fully protected.

The invention described here implements this protection scheme. Current limit is also gradually phased in so that the current clipping is soft. This improves the quality of the music by generating less higher order harmonics, while still providing full output protection.

This invention provides a simple and easy way to implement current limit in a variable frequency self oscillating class D modulator such as the modulator described in my co-pending patent application, Ser. No. 09/183,453, filed Oct. 30, 1998, which is incorporated by reference.

A method to sense the peak current in the MOSFETs and then generate a logic signal to indicate excessive current is described in my co-pending patent application Ser. No. 09/183,879, filed Oct. 30, 1998 which is incorporated by reference. This sensing circuit generates a logic signal as soon as the peak MOSFET current exceeds a preset threshold, so the delays normally associated with analog current limit circuits are eliminated and the new circuit is easily stabilized. The present invention works best with the sensing circuit described in that application but it will work with any circuit that can generate a logic signal in response to excessive current in the output MOSFETs such as the circuit 110 in FIG. 1 and the circuit in FIG. 5.

Since current limit into a dead short is undesirable, this invention incorporates a load impedance sensor. When the impedance of the load falls below the safe level, the amplifier is shut down immediately.

DRAWINGS

FIG. 1 is a schematic of a self oscillating variable frequency class D amplifier with active current limit;

FIGS. 2(a)–2(b) show comparative waveforms illustrating soft clipping (2A) and hard clipping (2B);

DETAILED DESCRIPTION

Figure 1:
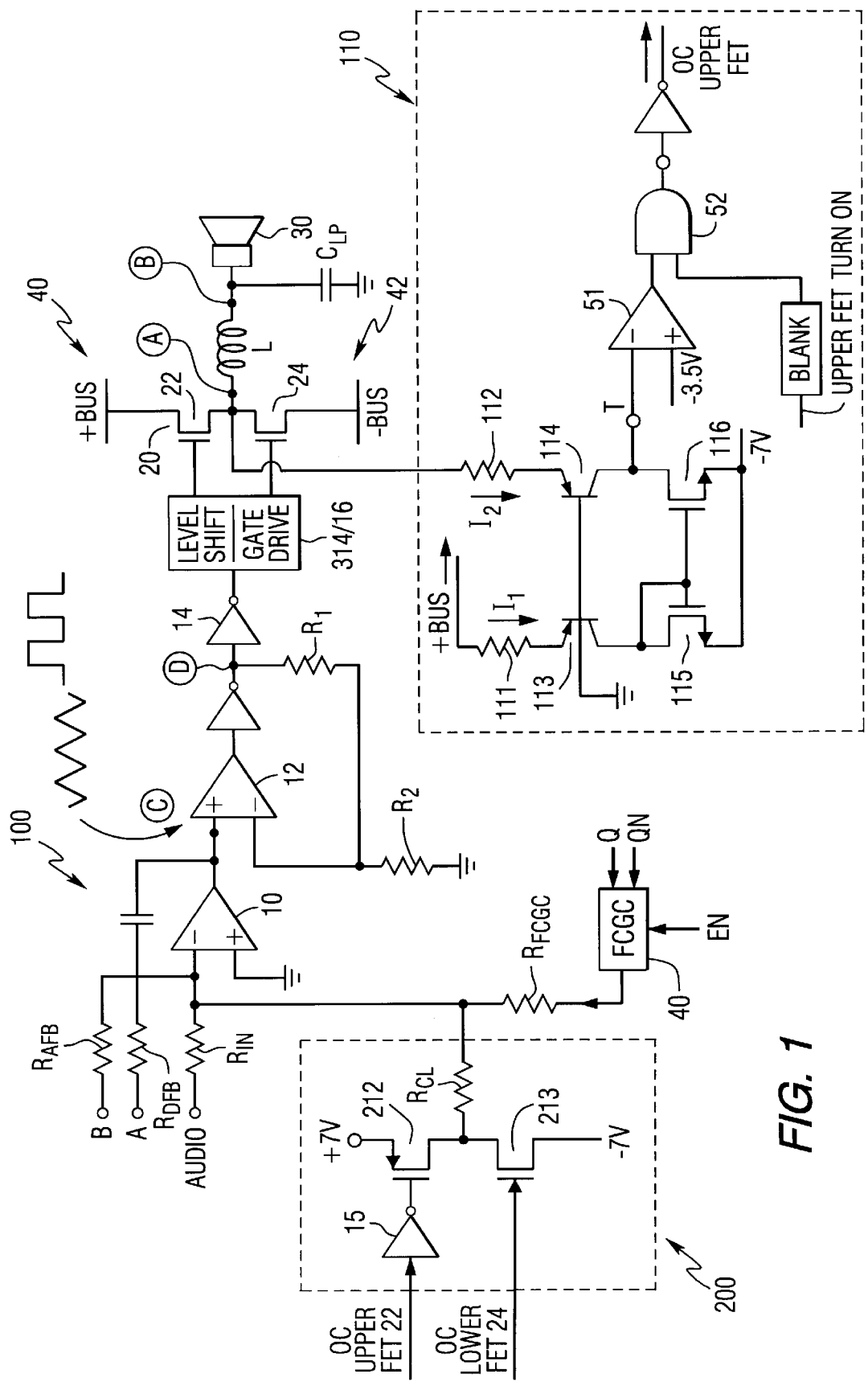

FIG. 1 shows a class D modulator 100 with an integrator 10, a comparator 12, a half bridge 20 and output speaker 30. Integrator 10 has an audio input over an input resistor $R_{IN}$. It has a digital feedback input A over resistor $R_{DFB}$, and an analog feedback at input B over resistor $R_{AFB}$. The respective analog and digital feedback signals A, B, are taken from the output of the bridge circuit 20 and the low-pass filter that comprises the inductor L and capacitor $C_{LP}$. For purposes of understanding, let us simply focus on the digital output A and assume that there is no audio input.

In this case, the output at point A is a square wave with a 50% duty cycle. When the square wave is high, current flows through $R_DF$ into the summing junction of the integrator 10. Its output ramps down until it reaches the negative threshold of the comparator 12. R1 and R2 are used to add hysteresis to the comparator 12. These resistors can be used to adjust the comparator positive and negative thresholds. When the output of the comparator 12 goes low, the upper FET 22 turns off and after a short delay the lower FET 24 turns on. The square wave goes low, and current now flows out of the integrator 10 summing junction through $R_{DFB}$. The output of the integrator 10 reverses and ramps up until it reaches the positive threshold of the comparator 12. This signals the lower FET 24 to turn off. After a short delay the upper FET 22 turns on. The square wave goes high and the cycle continues. With no audio signal, the output at A is a 50% square wave, and the output of the integrator 10 is a triangle wave.

Half bridge 20 includes two NMOS FETs 22, 24. They are connected in series between high voltage bus 40 (+60 volts) and low voltage bus 42 (−60 volts). Gate driver 314 and level shifter 16 control the operation of the FETs 22, 24. At the series connection of the two MOSFETs, their output is coupled to a low pass filter that comprises inductor 26 and capacitor 28. The low pass filter converts the digital output of the bridge 20 to an audio output that drives the load, loudspeaker 30.

When audio is applied through $R_{IN}$, the resulting current sums with the current through feedback resistor $R_{DFB}$. That changes the slope of the integrator output ramp. When the currents are in phase, the ramp is faster. Conversely, when the currents are out of phase, the ramp is slower. The triangle wave at point C becomes a sawtooth. The output of the comparator is pulse width modulated. To reduce distortion, additional feedback is taken from the output at point B. This improves the damping factor and compensates for non-linearities in the output filter.

The slope of the ramp at C varies with the input signal. This changes the frequency of the modulator. The switch frequency falls as the power is increased reaching DC when the current in $R_{IN}$ exactly balances the current in $R_{AFB}$ and $R_{DFB}$. This is not desirable so a frequency and gain control circuit is required.

Figure 2A:
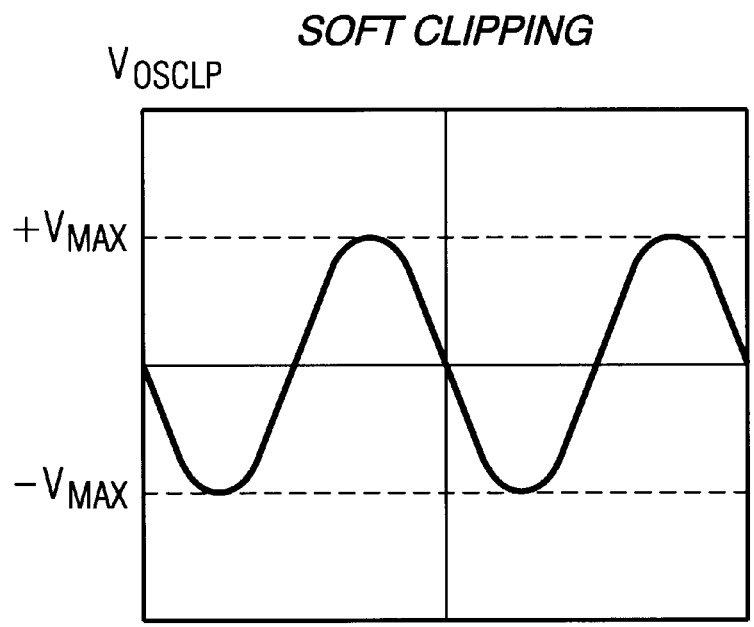
Figure 2B:
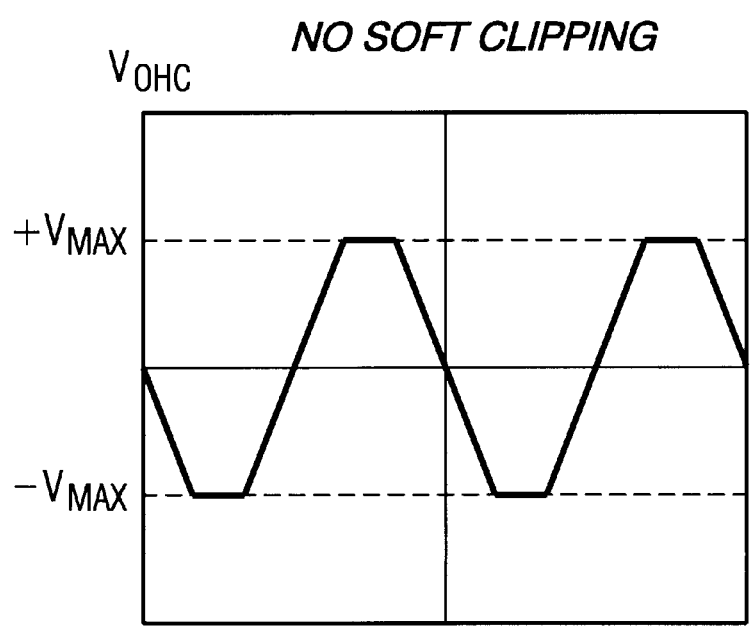

Frequency and gain control circuit (FCGC) 40 has inputs Q and QN. Signal Q represents the state of the output of the comparator 12; QN is the inverse of Q. Thus, Q is either high or low. The output of FCGC circuit 40 is coupled to a resistor $R_{FCGC}$ and from there to the integrator 10. The FCGC circuit 40 includes a current source, a capacitor, and an inverter for measuring the duration of each of the signals Q and QN. If the duration of either signal Q or QN exceeds a predetermined time window, typically 10 microseconds, the FCGC circuit will either inject or sink a current from the amplifier 10. When the signal Q or QN exceeds the time window, that indicates that the switching frequency is too low. Unless the situation is quickly remedied, the listener will detect audio artifacts that correspond to a hard clipping in the audio output. A typical hard clipped audio output is shown in FIG. 2B where the output of the prior art amplifier, $V_{OHC}$, is truncated at an output $V_{MAX}$ that corresponds to the maximum output of the amplifier. In order to prevent a hard clip and switching frequencies below 100 kHz, the FCGC circuit 40 injects or sinks current into the integrator 10 in order to rapidly change the state of the comparator 12. As such, if the output of the comparator 12 is Q, current is added to the integrator 10 in order to switch the comparator 12 to QN. Likewise, if the output of the comparator 12 is QN or low, current is removed from the integrator 10 in order to rapidly switch the comparator 12 to its high, Q output.

The FCGC circuit 40 effectively alters the gain of the amplifier 100 by either adding or subtracting current to the integrator 10. This phenomenon is known as gain compression and results in a modified output signal known as a soft-clipped signal. A typical soft-clipped signal is shown in FIG. 2A with the vertical axis identified as $V_{OSC}$. As the signal rises towards the maximum value $V_{MAX}$, the output $V_{OSC}$ gradually tapers. This gradual taper is distinctly different from the hard-clipped input waveform shown in FIG. 2B. Since the gain is reduced, the integrator 10 never saturates. As a further result, the sampling frequency of the amplifier 100 is automatically compensated to remain above the audio frequency. For example, in a preferred embodiment of the invention, the amplifier 100 maintains a sampling frequency at no less than 100 kHz for an approximate maximum output of 100 watts. As a result, above a chosen threshold that corresponds to the time window sampled by FCGC circuit 40, the amplifier 100 continuously and gradually reduces the gain in order to prevent a hard clip of the output signal and maintain the sampling frequency of the comparator at a frequency substantially greater than the frequency of the input audio signal.

Figure 3:
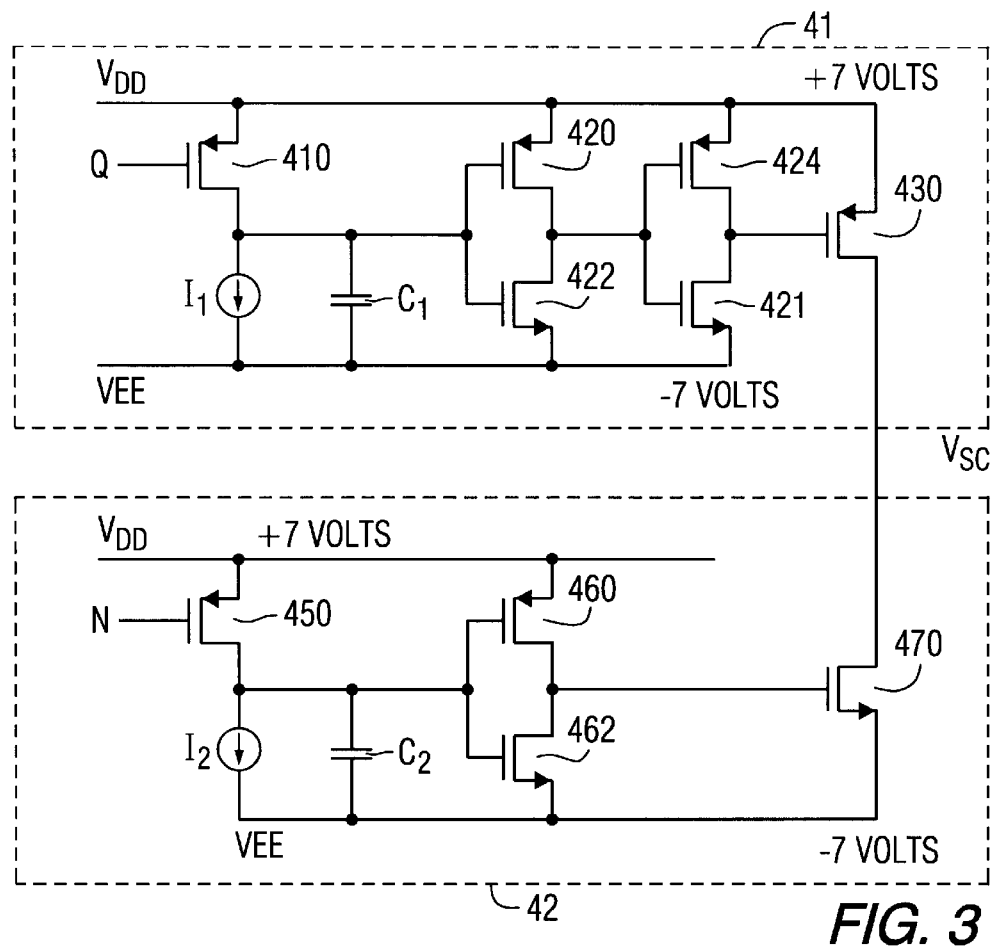
FIG. 3 is a schematic of a frequency and gain control circuit.

The FCGC circuit 40 is shown in greater detail in FIG. 3. The following description for subcircuit 41 will explain how the circuit operates after the comparator 12 has held signal Q high for more than 10 microseconds. Those skilled in the art will appreciate that subcircuit 42 is substantially identical to subcircuit 41 and compensates for the opposite state signal, QN.

When Q goes high, PMOS 410 turns off and $I_1$ begins discharging $C_1$. NMOS 422 is much larger than NMOS 420. So when C1 discharges to the threshold of 422 its drain transitions to high. After an inversion PMOS 430 turns on. In this embodiment, if Q stays high for 10 microseconds, 420 will turn on. Current is injected into the integrator 10 summing junction through $R_{FCGC}$.

This speeds up the ramp by increasing its slope. The PWM comparator will toggle faster. The net result is a reduced gain and high switching frequency. Subcircuit 42 works like 41. When QN is high for more than 10 microseconds, NMOS 470 turns on and pulls current out of the integrator summing junction through $R_{FCGC}$. The effect is the same; reduced gain and high switching frequency.

An upper FET over current detection circuit 110 includes two resistors 111 and 112, two pnp transistors 113 and 114, and a current mirror 115 and 116 as described in my co-pending application, Ser. No. 09/183,879, filed Oct. 30, 1998 which is incorporated by reference. Resistors 111 and 112 convert the high voltages present in the bridge 20 into a proportional current. For example, $I_1$=(+bus−Vbe)/R111 and when the upper FET is on, $I_2$=(+bus−Vbe−Von)/R112 where Vbe is the drop across the base emitter junction of the pnp, Von is the drop across the MOSFET 22, and R112 and R111 are the resistances of resistors 111 and 112 respectively. The current mirror, MOSFETs 115 and 116, compares $I_1$ and $I_2$. If $I_2$ is greater than $I_1$ the voltage at point T is high. Otherwise this voltage is low. Resistor 112 is chosen smaller than R111 so that under normal operation, when FET 22 turns on, $I_2$ is greater than $I_1$ and the voltage at point A is high. During an over current event, the drop across the FET 22, Von, is so great that $I_2$ is less than $I_1$ and the voltage a point T stays low. The relative values of resistors R111 and R112 set the over current threshold. In the preferred embodiment, resistor 12 is approximately 85% the value of resistor R111 and the $R_{DSON}$ of the FET is 180 mohms.

In order for this circuit to function as an over current detector, blanking is required. Under normal operation, point T is only high when FET 22 is on and the current in FET 22 is below the over current threshold. The upper FET blanking circuit allows FET 22 to turn on and point T to go high before any decision concerning over current is made. The output signal T is compared to a reference voltage of −3.5 volts. When the upper FET begins to turn on, a 300 ns blanking pulse begins. If T does not go high before the blanking pulse ends then the output of the nand gate 52 will go low and the signal OC upper FET will go high. This signals an over current event in FET 22. The bridge can be shut down, or other measures can be taken to reduce the current. The advantage of this circuit is that the need to bring the high voltage bus on chip is eliminated. Furthermore, both the upper and lower FET can be protected.

Those skilled in the art understand that a corresponding lower FET over current detection circuit (not shown) and a lower FET blanking circuit (not shown) provide the signal OC lower FET.

The over current limit (OCL) circuit 200 comprises transistors 213, 212, inverter 15 and resistor Rcl. As explained above, the gain of this modulator 100 is compressed by controlling the current into the summing junction of the integrator 10. The OCL circuit 200 uses that technique to achieve current limit. The audio signal is converted to a current by Rin and applied to the summing junction of the integrator. Gain compression is accomplished by reducing the effective input current flowing into or out of the integrator-summing junction. The current limit components, 213, 212, 15 and Rcl can work with any over current detection circuit to reduce the effective input current and thus reduce the gain and current in the amplifier.

The OCL 200 receives two logic signals: the first, OC upper FET, is high when an over current condition exists in the upper FET 22; the second, OC lower FET, is high when an over current condition exists in the lower FET 24.

When the over current condition is in FET 22, PMOS 212 will turn on and inject current into the summing junction of the integrator, 10, through Rcl. The net effect is turn off the upper FET 22 and turn on the lower FET 24. This reduces the current in FET 22. As far as amplifier 100 is concerned, the net effect is gain compression. Since upper FET 22 is on less and the lower FET 24 is on more, the gain of the audio signal is reduced. This technique regulates the peak current in the MOSFET. When the over current condition is in FET 24, NMOS 213 turns on and pulls current out of the summing junction, turns the lower FET 24 off, and turns the upper FET 22 on. The net effect is to reduce the current in the lower FET. At audio frequencies, the gain is reduced.

The OCL circuit 200 has significant advantages over prior art interruption circuits:
1) The OCL circuit 200 is very fast. The feedback is done digitally so no filtering of the audio output is required and there is little or no delay. Since the feedback is taken before the output filter, the delay of this filter is not an issue. This technique will not work if the OC current is generated after the low pass filter. The phase shift will inevitably lead to positive feedback.
2) The OCL circuit 200 is easily stabilized. In contrast, the delays inherent in a filtered analog feedback loop make such systems very difficult to stabilize.
3) The OCL circuit 200 gradually reduces the gain of the amplifier 100. This results in soft clipping and eliminates the unwanted audio artifacts caused by hard clipping.
4) The impedance of speakers 30 can often dip below the DC rating. Thus, audio amplifiers with an over current latch off circuits are prone to nuisance trips. The current limit approach eliminates such trips.

Figure 5:
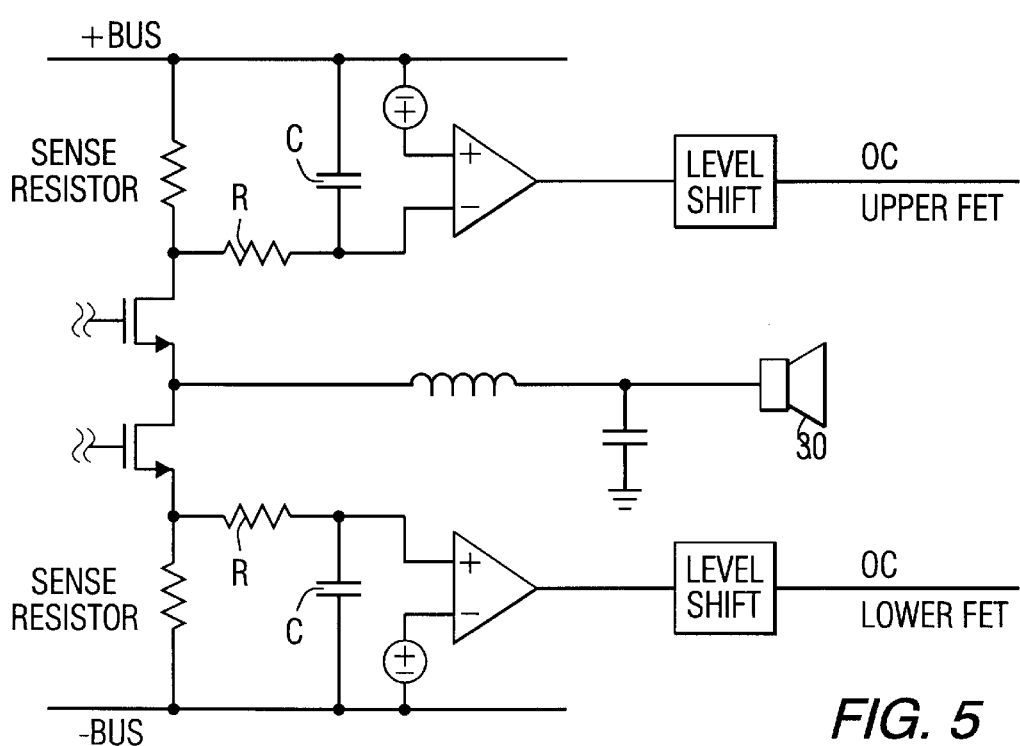
FIG. 5 is a prior art schematic of a circuit for generating logic signals for the over current limit circuit.
Figure 4:
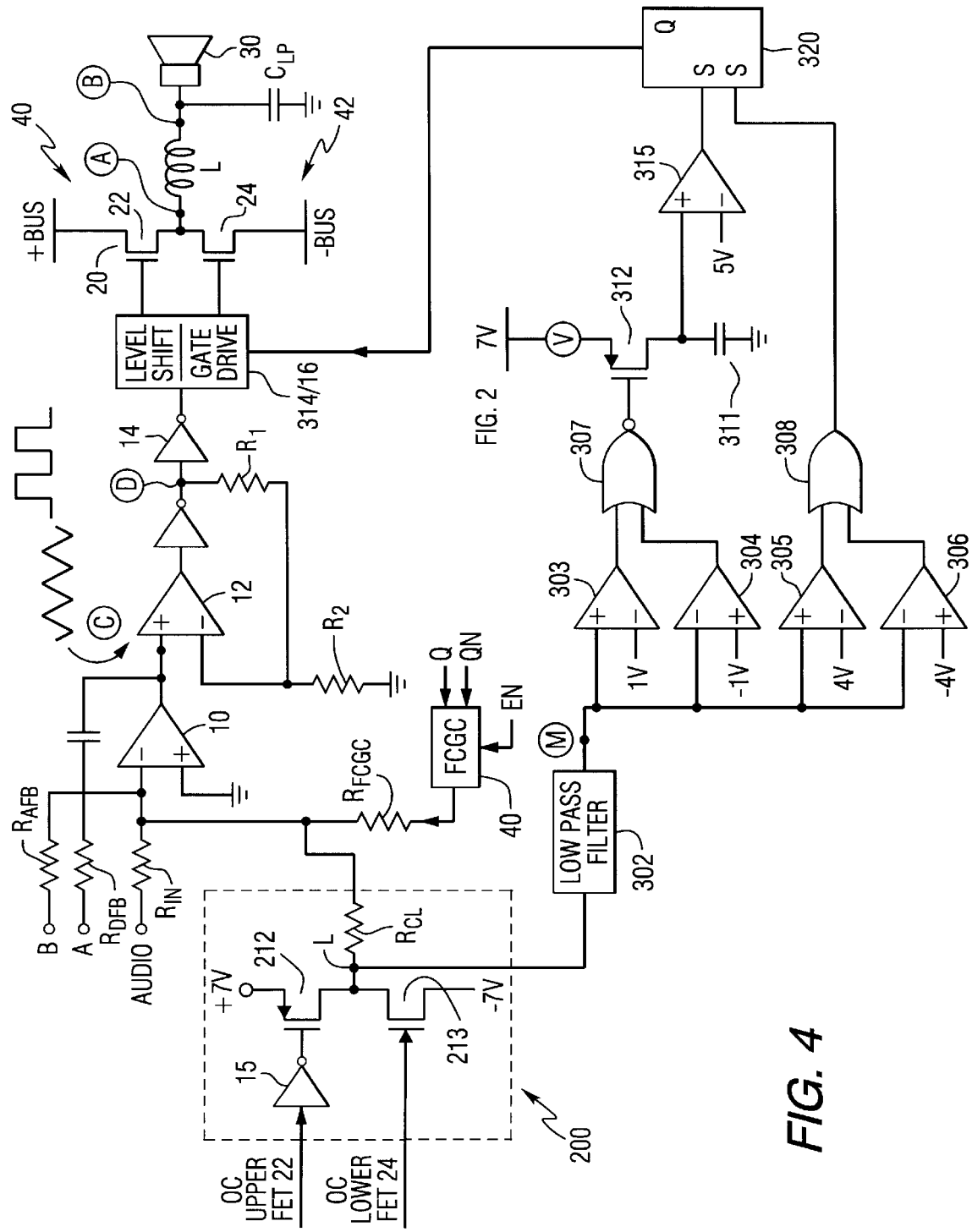
FIG. 4 is a schematic of a low impedance detection circuit designed to detect the presence of a dead short at the output of the class D amplifier.

The detection circuit 110 is omitted from FIG. 4 to make it easier to explain the operation of low impedance control (LIC) 300. LIC 300 improves on the design of the circuit in FIG. 1 by incorporating a fast latch off feature. Those skilled in the art understand that detection circuit 110 or another detection circuit such as the one shown in FIG. 5 are needed to provide the requisite logic signals OC upper FET and OC lower FET. In an audio amplifier it is desirable to detect the difference between a low impedance speaker and a short circuit. In the case a low impedance speaker, current limit is also required. On the other hand, for a short, an over current latch is desirable. Otherwise, the amplifier will have to work very hard to drive the short. This may cause a premature failure and excessive heating. In the event of a very low impedance (less than ¼ of the nominal value), it is desirable to shut the amplifier off immediately. The circuit in FIG. 4 senses the duty cycle at point L to judge the impedance of the load. Point L is tri-stated when the amplifier is not in current limit. Thus, its voltage is near the same as the integrator-summing junction that should be very close to ground.

LIC control circuit 300 senses the duty cycle at point L. This duty cycle is proportional to load current. Thus, it is a measure of the load impedance. When this impedance (as measured by the current) falls below an acceptable limit, the amplifier is shut down immediately. This fast over current latch off feature protects the amplifier from dead shorts.

When there is an over current in FET 22, point L pulses between +7 and ground. The duty cycles of these pulses increases as the load impedance drops, because more gain compression is needed to achieve current limit. After a low pass filter 302, the analog signal at point M is fed into the input of two comparators, 303 and 305. If this signal is greater than 1 v, it means that the amplifier 100 is experiencing a slight overload. The output of gate 307 is low and PMOS 312 is on. The current source begins to charge a time out capacitor 311. When the voltage on this capacitor reaches 5 v, comparator 315 toggles and the over current latch 320 is set. Thus, during light overloads, the amp must stay in current limit for a time out period before the latch is set and the amplifier shuts down. If the load impedance is very low, then the voltage at point M will exceed 4 v and comparator 305 will toggle. This will immediately set the latch 320.

When there is an over current in FET 24, point L pulses between −7 and ground. The duty cycles of these pulses increases as the load impedance drops, because more gain compression is needed to achieve current limit. After a low pass filter, the analog signal at point M is fed into the input of two comparators, 304 and 306. If this signal is less than −1 v, it means that amplifier 100 is experiencing a slight overload. The output of gate 307 is low and PMOS 312 is on. The current source begins to charge a time out capacitor. When the voltage on this capacitor reaches 5 v, comparator 315 toggles and the latch is set. Thus, during light overloads, the amp must stay in current limit for a time out period before the latch is set. If the load impedance is very low, then the voltage at point M will be less than −4 v and comparator 306 will toggle. This will immediately set the latch and shut the amplifier down.

The ratio of Rcl and Rin is important as it sets the threshold between the detection of low load impedance and a short. If Rcl is chosen so that its current is greater than that of Rin at the maximum audio input signal, then the fast over current latch off will never engage because small duty cycles at point L can limit the current. The amplifier will always enter current limit. This is often not desirable, because the maximum output current will be delivered to a short. Rcl is chosen so that it can not supply as much current as Rin. This way the duty cycle at point L will increase rapidly as the load impedance falls, activating the fast over current latch off much earlier.

What is claimed is:
1. In a class D amplifier with a bridge circuit, an over current limiting circuit comprising in combination:
a self oscillating pulse width modulator including an integrator with feedback from the output of the amplifier and a comparator coupled to the output of the integrator;
a bridge gate driver circuit coupled between the modulator and a MOSFET bridge circuit for controlling gates of the MOSFETs in the bridge circuit; the bridge circuit connected between high and low voltage power busses and comprising at least two MOSFETs connected in series with each other;
a load impedance connected to the output of the bridge circuit;
first and second over current sensing circuits each including a voltage conversion circuit for sensing the voltage drops across the MOSFETS to derive signals represen- tative of the currents in the MOSFETS and each including a comparator circuit for comparing the current signal to reference signals and generating an over current output signal representative of an over current condition; and an over current limiting circuit, responsive to the over current output signal, and including a current source for injecting current into the integrator or extracting current from the integrator to reduce the effective input current to the integrator when the current in either MOSFET is greater than a current limit threshold.

2. The class D amplifier of claim 1 wherein the over current limiting means comprises one or more current sources for injecting current into the integrator or extracting current from the integrator to reduce the effective input current to the integrator when the current in either MOSFET is greater than a current limit threshold.

3. The class D amplifier of claim 2 where the current sources comprise a pair of transistors commonly coupled to a resistor, the resistor coupled to the integrator of the class D amplifier and logic means coupled to control terminals of the transistors for selecting one of the transistors to inject or extract current from the integrator.

4. The class D amplifier of claim 3 wherein the logic means comprises means for sensing the current in bridge circuit and for comparing the sensed current to a reference to generate a logic signal representative of an over current condition.

5. The class D amplifier of claim 3 further comprising a low impedance sensing circuit for sensing the duty cycle at the connection of the resistor and transistors and generating a signal representative of load impedance.

6. The class D amplifier of claim 5 wherein the low impedance sensor comprises a low pass filter, four comparators each with different reference levels for distinguishing between a low impedance and a short circuit and for shutting the amplifier down as soon a short circuit is detected.

7. The class D amplifier of claim 5 further comprising a time out capacitor coupled to the load sensing resistor, said time out capacitor charging to a value before shutting down the amplifier.

8. The class D amplifier of claim 2 wherein the over current limiting means comprises a transistor with one terminal coupled to a power supply, another terminal coupled to the integrator and a control terminal coupled to the means for sensing the over current in one of the MOSFETs.

9. The class D amplifier of claim 3 further comprising positive and negative power supplies and the over current limiting means comprises a first transistor coupled to the positive power supply with a control terminal coupled to one MOSFET and a second transistor coupled to the negative power supply with a control terminal coupled to the other MOSFET.

10. The class D amplifier of claim 1 wherein the means for sensing the voltage drop across the MOSFETs comprises:

a first conversion circuit for converting the voltage drop across one of the MOSFETs into a current signal representative of the voltage across said one MOSFET, said first conversion circuit having an output signal representative of the current through said one MOSFET;

a second conversion circuit for converting the voltage drop across the other of the at least two MOSFETs into a current signal representative of the voltage drop across the other MOSFET, said second conversion circuit having an output signal representative of the current through said other MOSFET.

11. The class D amplifier of claim 1 further comprising low impedance current limiting means coupled between the over current limiting means and the gate driver for rapidly disabling the drive to the gates of the MOSFETs when the load falls below a first threshold.

12. The class D amplifier of claim 11 wherein the over current limiting means generates an over current limiting signal and the low impedance current limiting means comprises a low pass filter for converting the over current limiting signal into a low impedance current limiting signal with an amplitude representative of the load, to drivers for the MOSFETs when a first load impedance threshold is exceeded.

13. The class D amplifier of claim 11 wherein the low impedance current limiting means comprises a low pass filter coupled to 200, a plurality of comparators coupled to the low pass filter and to different reference thresholds, and a latch for rapidly terminating operation of the gate drivers for the MOSFETs when a first load impedance threshold is exceeded.

14. The class D amplifier of claim 13 further comprising a current source and a capacitor coupled between the comparators and the latch for delaying operation of the latch a delay time set by the capacitor when the load impedance exceeds a second threshold.

* * * * *